United States Patent [19]
Suzuki et al.

[11] 3,961,666
[45] June 8, 1976

[54] HEAT DISPERSION DEVICE FOR USE IN AN ELECTRONIC APPARATUS

[75] Inventors: Tadao Suzuki, Tokyo; Hirohito Kawada, Chofu; Yasuo Sugimoto, Musashino, all of Japan

[73] Assignee: Sony Corporation, Tokyo, Japan

[22] Filed: Nov. 20, 1973

[21] Appl. No.: 417,520

[30] Foreign Application Priority Data
  Nov. 24, 1972 Japan.............................. 47-135276
  July 2, 1973 Japan.............................. 48-78628

[52] U.S. Cl................................ 165/129; 165/80; 317/100; 357/82
[51] Int. Cl.²......................................... F24H 9/02
[58] Field of Search............... 317/100; 357/81, 82; 165/80, 128, 129

[56] References Cited
UNITED STATES PATENTS

| | | | |
|---|---|---|---|
| 1,728,537 | 9/1929 | Geiger | 357/81 |
| 1,845,573 | 2/1932 | Ackerly | 357/81 |
| 2,815,472 | 12/1957 | Jackson | 317/100 |
| 2,965,819 | 12/1960 | Rosenbaum | 165/128 |
| 3,253,646 | 5/1966 | Koltuniak | 317/100 |
| 3,277,346 | 10/1966 | McAdam | 317/100 |
| 3,314,242 | 4/1967 | Lefferts | 165/80 |
| 3,364,987 | 1/1968 | Bylund | 165/80 |
| 3,369,597 | 2/1968 | Dronsuth | 165/80 |
| 3,384,168 | 5/1968 | Richter | 165/55 |
| 3,518,838 | 7/1970 | Newton | 357/81 |
| 3,727,114 | 4/1973 | Oshima | 357/81 |

*Primary Examiner*—Charles J. Myhre
*Assistant Examiner*—Daniel J. O'Connor
*Attorney, Agent, or Firm*—Lewis H. Eslinger; Alvin Sinderbrand

[57] ABSTRACT

A heat dispersion device for use in an apparatus having at least one heat-generating electronic element, such as, a power transistor, includes a thermally conductive heat dispersion member having a portion on which the heat-generating electronic element is mounted and a set of fins defining channels therebetween opening at the top and bottom of the set of fins, and a duct extending upwardly from the set of fins and communicating with the channels between the latter so that the generated heat is dispersed to air flowing upwardly in the channels and the heated air is conducted upwardly in the duct away from the heat dispersion member. For maximum effectiveness, the distance from the bottom of the set of fins to the top of the duct is made at least twice as large as the distance between the top and bottom of the set of fins. Further, the heat dispersion device may include a plurality of heat dispersion members, as aforesaid, assembled together with one or more ducts to provide a required heat dispersing capacity.

11 Claims, 13 Drawing Figures

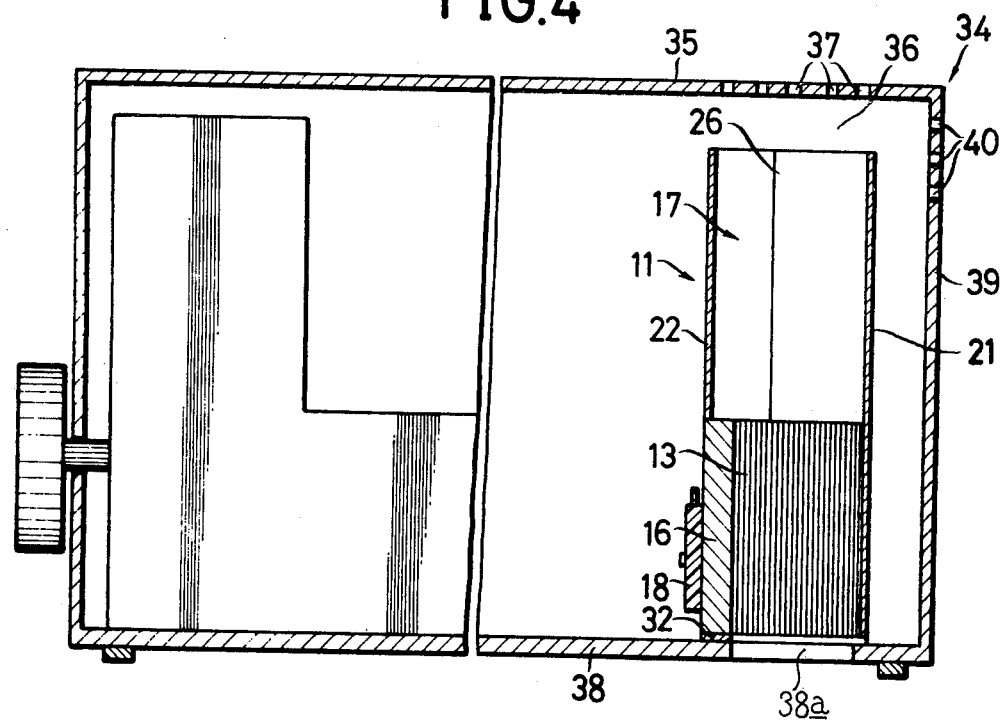
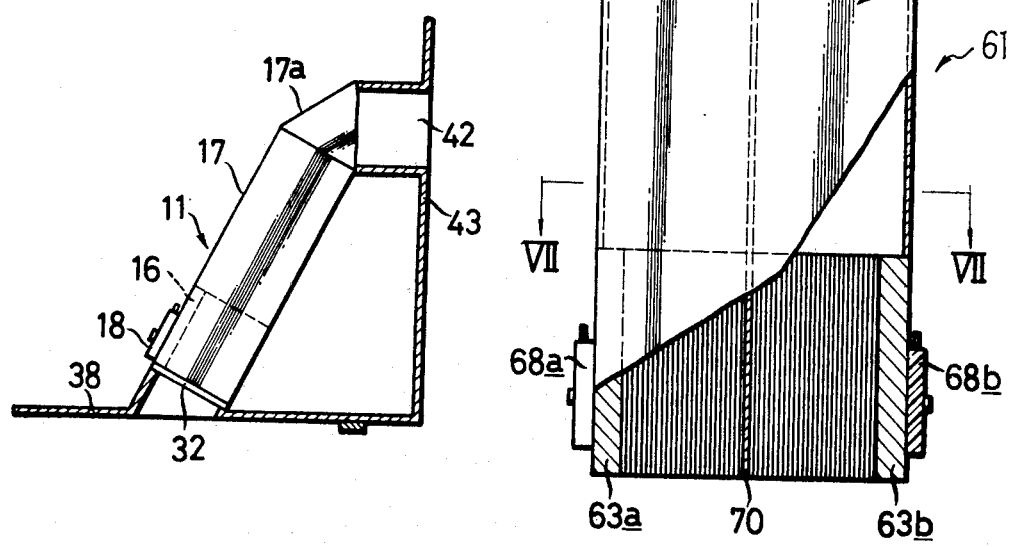

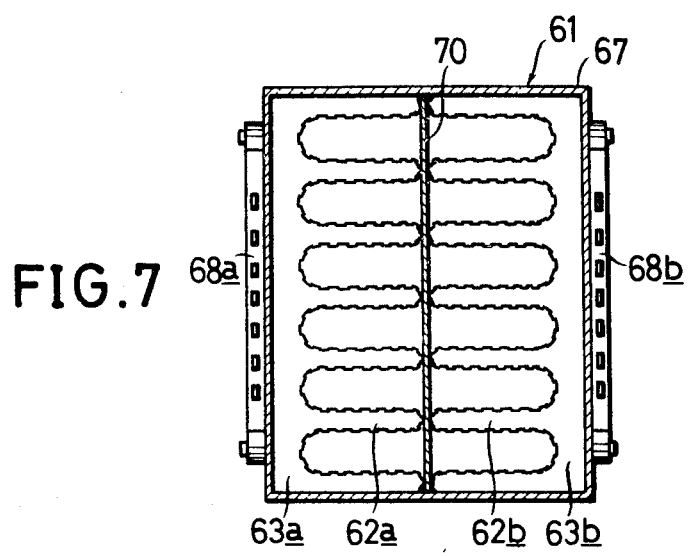
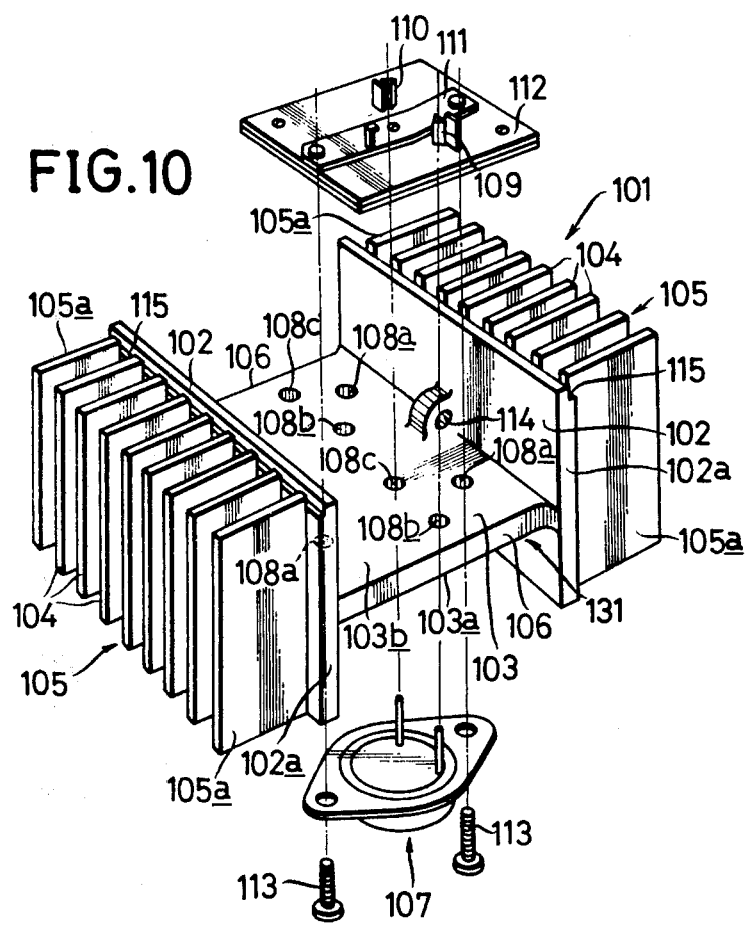

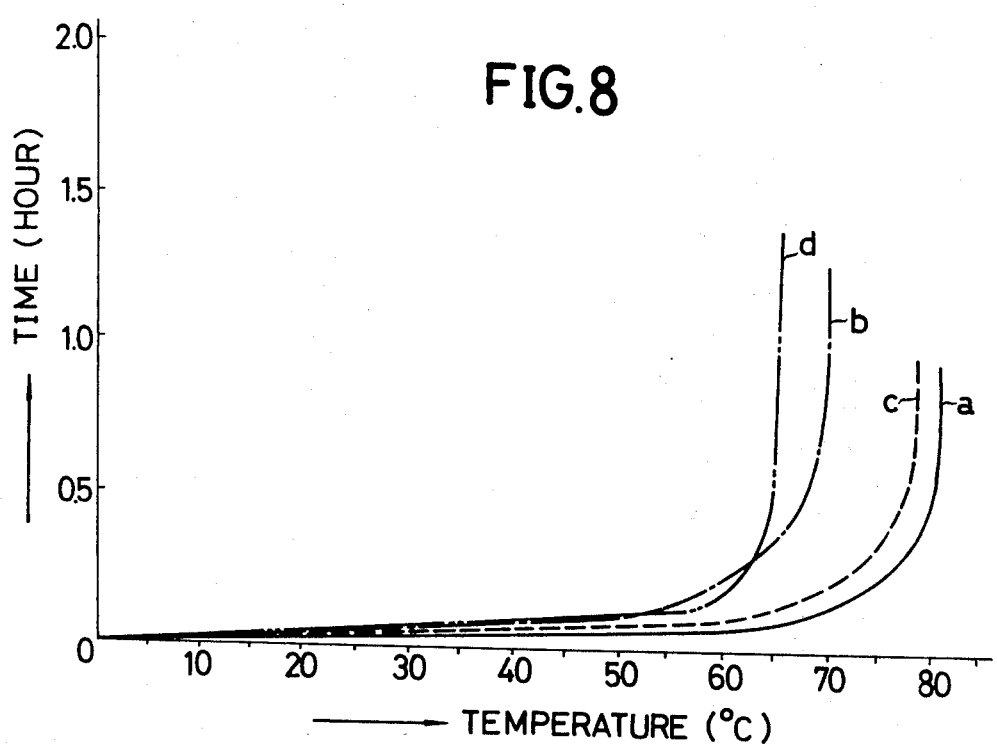
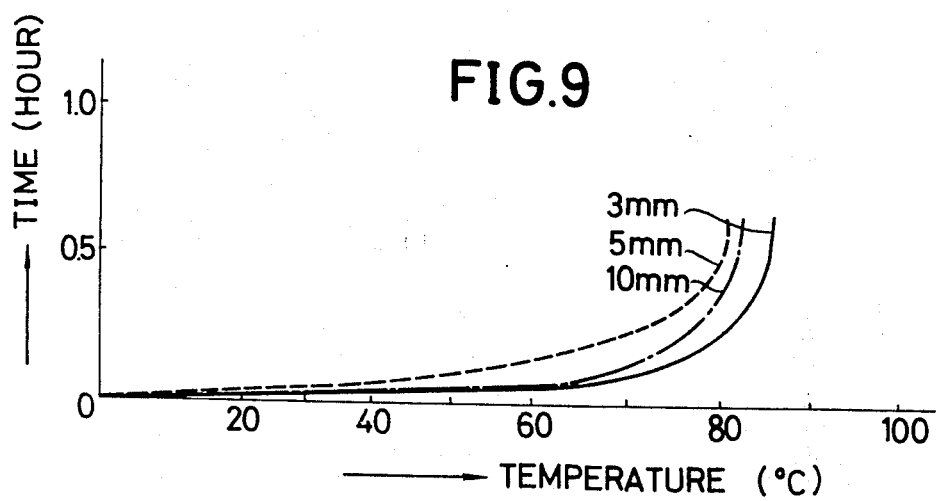

HEAT DISPERSION DEVICE FOR USE IN AN ELECTRONIC APPARATUS

BACKGROUND OF THE INVENTION

1. Field of the Invention

This invention relates to a heat dispersion device for use with an electronic apparatus, and more particularly to a novel heat dispersion device provided with an air duct.

2. Description of the Prior Art

At least one power transistor or an integrated circuit containing a number of semiconductive elements may be used in an electronic apparatus for the amplification of an audio signal or a video signal. Such power amplifying electronic elements generate much heat because they consume large amounts of power as compared with other parts, for example, a stage for amplifying an intermediate frequency signal. As is generally known, semiconductive elements are sensitive to heat and are susceptible to break-down when too much heat is generated by the semiconductive elements. Therefore, power amplifying electronic elements are usually mounted on a heat dispersion device referred to as a "heat sink", whereby the heat generated by the electronic element or elements is transmitted to the heat dispersion device and from the latter to the atmosphere for minimizing the temperature-rise of the electronic element or elements.

An existing type of heat sink is formed of aluminum and has a number of heat-dispersing fins. The heat sink is colored black and the power amplifying electronic element is mounted in a hollow or recess formed by a number of the heat-dispersing fins. Heat generated by the electronic element is dispersed only by the radiation thereof to the atmosphere from the heat-dispersing fins, or the heat is transmitted to the chassis on which the heat sink is mounted. In order to obtain a sufficient heat-dispersing effect merely by radiation from the heat-dispersing fins, it has been necessary to employ a heat sink of large dimensions for providing a large heat-dispersing surface. However, by increasing the size of the heat sink, a satisfactory heat-dispersing effect cannot always be obtained, but there is the further disadvantage that the cost of the heat sink is increased with its size. Since there is the possibilty that the temperature in a casing or cabinet containing the heat sink may rise appreciably because of the poor heat-dispersing effect, the heat sink is often mounted on the outside of the casing. However, in this case, there is the danger that the user may touch the heat sink and suffer burns therefrom. Further, with the existing type of heat sink having heat dispersing fins, the number and dimensions of the fins have to be designed for the specific heat-generating electronic element or elements to be mounted thereon, for example, a heat sink for use with a single power transistor, as in a monaural audio system cannot be used, or readily adapted for use with the plural power transistors required in a stereophonic system.

Another type of conventional heat dispersion device in use consists of an air duct of metal mounted directly on the power transistor. The air duct works to disperse the heat generated by the power transistor and to lead the heated air upwardly therefrom. This type of heat dispersion device is effective for a single power transistor of small capacity, but it is not suitable for the dispersion of heat from a plurality of the power transistors or from a power transistor of large capacity.

SUMMARY OF THE INVENTION

An object of the present invention is to provide a novel heat dispersion device which avoids the above mentioned disadvantages of the existing devices.

Another object is to provide a heat dispersion device suitable for a power amplifying electronic element of large capacity in which heat is effectively dispersed by the convection of air.

A further object is to provide a heat dispersion device in which good heat dispersion can be obtained by a suitable selection of the ratio of the height of a finned heat dispersion member to that of an air duct extending therefrom.

Still another object of the present invention is to provide an inexpensive heat dispersion device with which a sufficient heat-dispersing effect can be obtained while minimizing the size of the device.

A still further object is to provide a heat dispersion device which can be wholly contained within the cabinet of an electronic apparatus for increased safety.

A still further object of the present invention is to provide a heat dispersion device that can be easily and accurately adapted to provide any desired heat dispersing effect up to a very high heat-dispersing effect by the assembling together of a selected member of fundamental units of the heat dispersion device.

In accordance with an aspect of the invention, a heat dispersion device comprises one or more thermally conductive heat dispersion members each including a portion on which a heat-generating electronic element is mounted and one or more sets of spaced apart fins defining channels therebetween opening at the top and bottom of the respective set of fins, and an open-ended duct extending upwardly from, and communicating with the openings of the channels at the top of the set of fins so that heat from the electronic element is dispersed through the heat dispersion member to the fins thereof and from the latter to air entering the channels at the bottom of the fins, with the resulting heated air flowing upwardly, by convection, through the duct.

The foregoing, and other objects, features, and advantages of the invention, will be apparent from the following detailed description of preferred embodiments of the invention which is to be read in conjunction with the accompanying drawings.

BRIEF DESCRIPTION OF THE DRAWINGS

FIG. 4 is a schematic cross-sectional view of an electronic apparatus containing the heat dispersion device of FIG. 1;

FIG. 5 is a fragmentary view, partly in cross-section, and the heat dispersion device of the invention mounted in an inclined manner in the electronic apparatus;

FIG. 6 is an elevational view of a second embodiment of a heat dispersion device according to this invention for use with heat-generating electronic elements, and which is shown partly broken away;

FIG. 7 is a cross-sectional view taken along the line VII—VII on FIG. 6;

FIG. 8 is a graph showing the relationship of temperature to time for heat dispersion devices of different shapes;

FIG. 9 is a graph showing the relationship of temperature to time for heat dispersion devices having different spacings between their heat-dispersing fins;

FIG. 10 is an exploded perspective view of a unit of a third embodiment of a heat dispersion device according to this invention;

DESCRIPTION OF THE PREFERRED EMBODIMENTS

Figure 1:
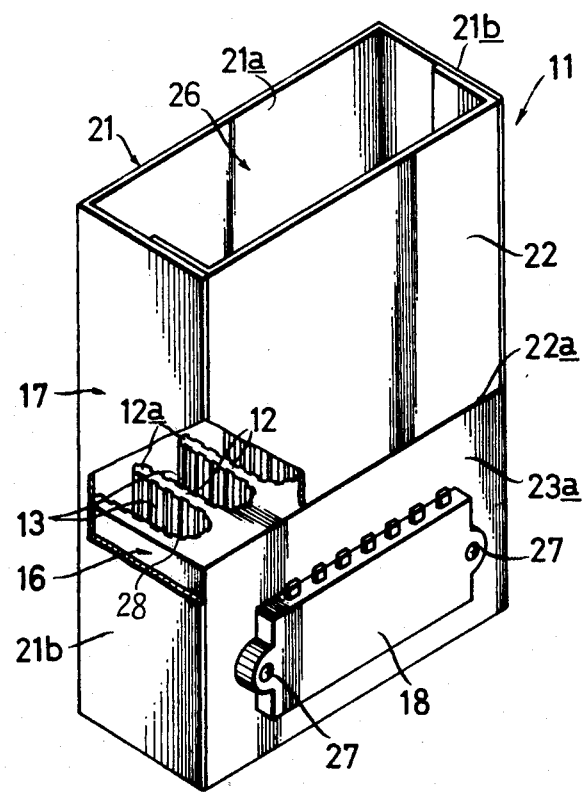
FIG. 1 is a perspective view of a heat dispersion device according to one embodiment of this invention for use with a heat-generating electronic device, and which is shown partly broken away.
Figure 3:
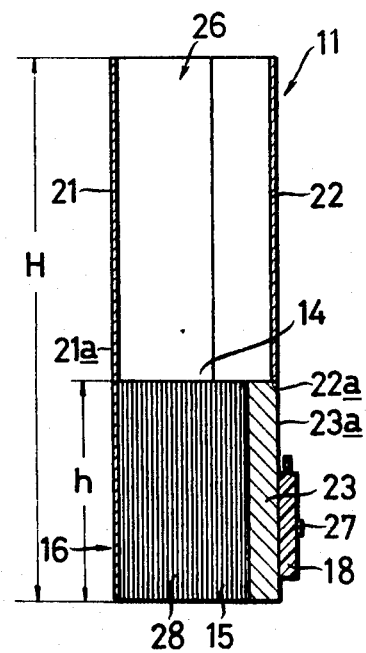
FIG. 3 is a cross-sectional view taken along the line III—III on FIG. 2.
Figure 2:
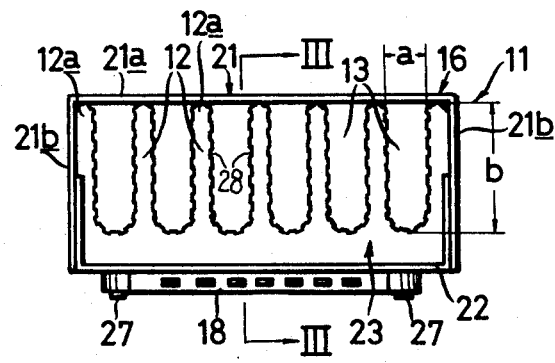
FIG. 2 is a top plan view of the heat dispersion device shown in FIG. 1.

Referring to the drawings in detail, and initially to FIGS. 1-3 thereof, it will be seen that a heat dispersion device 11 according to this invention is shown to include a heat dispersion member 16 of a thermally conductive material, such as aluminum, having a portion 23 which is in the form of an erect plate in this embodiment, and a set of substantially parallel, spaced apart fins 12 extending from one side of plate-like portion 23 so as to define channels 13 between the fins which open, as at 14 and 15 on FIG. 3, at the top and bottom of the set of fins 12. The heat dispersion device 11 is further shown to include an open-ended duct 17 mounted, at its lower end portion, on the heat dispersion member 16 and extending upwardly therefrom in communication with channels 13.

A heat-generating electronic unit or device 18, for example, a "Power Pack" including a number of power amplifying semiconductive elements which may be used for amplifying audio signals, may be mounted, as by screws 27, on the outer surface 23a of plate-like portion 23 of the heat dispersion member 16, that is, on the side of plate-like portion 23 opposite from fins 12.

The open-ended duct 17 may be in the form of a rectangular parallelepiped constituted by U-shaped members 21 and 22 respectively having relatively long and short side portions which are joined to each other, as shown. The duct 17 may be formed of sheet metal, heat-resisting plastic and the like, but a material with relatively low thermal conductivity is preferred. The U-shaped member 22 having relatively short sides is secured, at its lower edge 22a, to the top of heat dispersion member 16 so that the outer side or surface 23a of plate-like portion 23 is exposed below member 22 of the duct. The lower parts of central portion 21a and side portions or arms 21b of U-shaped member 21 extend to the bottom of heat dispersion member 16 and are secured to the latter so that the lower part of duct 17 encloses the heat dispersion member 16 with the exception of the surface or side 23a at which the heat-generating electronic unit or device 18 is mounted. As shown particularly on FIG. 2, the lower part of central portion 21a of U-shaped member 21 is in contact with the free end edges 12a of fins 12 so as to close channels 13 at the side of the latter remote from plate-like portion 23.

It will be apparent that air entering channels 13 through the openings 15 thereof at the bottom of member 16 can flow upwardly through channels 13 and exit therefrom through the openings 14 at the top of member 16 for further upward flow through duct 17 and eventual discharge from the latter at the top opening 26 of the duct. In order to increase the area of contact of heat dispersion member 16 with air in channels 13, the surfaces of fins 12 and plate-like portion 23 which define channels 13 are formed with undulations or ribs, as at 28.

In accordance with this invention, the spacing or distance $a$ between adjacent fins 12 is in the range between 3mm. and 10mm., and preferably in the range between 5mm. and 7mm. If the spacing $a$ is made less than 3mm., the viscous resistance of the air to flow relative to fins 12 increases very substantially and thus interferes with the upward flow by convection of the air in channels 13. On the other hand, if the spacing $a$ is made greater than 10mm., the area of contact of the air with the fins 12 defining channels 13 decreases to the point where an adequate heat-dispersing effect is not achieved. The distance $b$ that fins 12 project from plate-like portion 23 is preferably substantially greater than 5mm., for example, the distance $b$ may be approximately 25mm. Further, in accordance with this invention, the distance H from the bottom of the set of fins 12 to the top of duct 17 is at least twice as large as the distance $h$ between the top and bottom of the set of fins 12 which, for example, may be approximately 50mm. (FIG. 3).

The above described heat dispersion device 11 operates as follows:

Heat from the heat-generating electronic unit or device 18 heats the heat dispersion member 16 and is efficiently transferred to the air in channels 13 by reason of the large area of contact of the air with the surfaces of fins 12. The heated air in channels 13 expands and, by reason of its relatively reduced specific weight, flows rapidly upward through channels 13 and into duct 17. The duct 17 provides a chimney-effect, and thus creates a draft or suction which increases the rate of flow of the air upwardly through channels 13 from the openings 15 at the bottom thereof. Of course, the heated air entering duct 17 from channels 13 flows upwardly through the duct and is discharged therefrom at the opening 26 at the top of the duct. As a result of the chimney-effect of duct 17 which is achieved only when the dimensions H and $h$ have the previously described relationship, and further as a result of the previously described spacing $a$ between adjacent fins 12, the high speed convection of air is obtained through the heat dispersion member 16 and, therefore, the heat from electronic unit or device 18 is very effectively dispersed.

When the central portion 21a of the member 21 of duct 17 is in close contact with the free end edges 12a of fins 12 so as to isolate the channels 13 from each other, as previously described, the highest heat-dispersing effect is obtained. However, a small gap, for example, up to about 5mm., between central portion 21a and the end edges 12a of the fins does not seriously affect the heat-dispersing effect.

Referring now to FIG. 4, it will be seen that the heat dispersion device 11 according to this invention may be mounted completely within the cabinet 34 of an electronic apparatus, for example, a stereophonic amplifier. When thus mounted, a gap 36 with a width of about 5mm. is provided between the top wall 35 of the cabinet and the upper end of duct 17, and one or more holes or openings 37 are provided in top wall 35 above the opening 26 at the top of duct 17 so that heated air being discharged from duct 17 can escape from cabinet 34 through holes 37. A vertical wall of cabinet 34, for example, the back wall 39 thereof, is preferably also provided with openings 40 so that, when holes or openings 37 are closed, for example, by a paper or book placed on the top wall 35, the heated air discharged from duct 17 into gap 36 can escape from the interior of cabinet 34 through the holes or openings 40. A thin heat-resistant and insulating base plate 32, for example, of bakelite, having the same shape as the bottom surface of heat dispersion member 16 is preferably disposed between such bottom surface and the bottom wall 38 of cabinet 34 which is formed with a suitably located opening 38a through which air can enter the channels 13. The heat resistant and insulating base plate 32 ensures that heat from the heat dispersion member 16 will not be transmitted to the chassis or other parts of the electronic apparatus.

In FIG. 4, the heat dispersion device 11 according to this invention is shown mounted in a vertical position within the cabinet 34 of an electronic apparatus. However, as shown on FIG. 5, the heat dispersion device 11 may be mounted within the cabinet in an inclined position, in which case, an additional air duct or extension 17a may be connected to the upper end of duct 17 and extend to an opening 42 in a side wall 43 of the cabinet for ensuring that the previously described high heat-dispersing effect will be obtained.

In the heat dispersion device 11 described above with reference to FIGS. 1–3, a single heat dispersion member 16 is provided in combination with the duct 17 for dispersing heat from a single electronic unit 18. However, in heat dispersion devices according to this invention, two or more heat dispersion members having heat-generating electronic units respectively mounted thereon can be combined with one or more ducts for effectively dispersing heat from such electronic units in accordance with the principles of this invention. For example, as shown on FIGS. 6 and 7, a heat dispersion device 61 according to this invention may comprise two heat dispersion members 63a and 63b which are each similar to the previously described heat dispersion member 16, and which are assembled together with their respective fins 62a and 62b directed toward each other. The heat dispersion device 61 is further shown to include an open ended duct 67 extending upwardly from the assembled together members 63a and 63b, and leaving exposed the opposed or outer surfaces of such members 63a and 63b to which respective heat-generating electronic units or power packs 68a and 68b are secured. A partition or separator 70, preferably of a heat-insulating material, extends between the adjacent end edges of fins 62a and 62b (FIG. 7) and upwardly through duct 67 to the upper end of the latter so as to divide the interior of duct 67 into two isolated channels which respectively communicate, at their lower ends, with the channels defined between the fins 62a and 62b of heat dispersion members 63a and 63b.

The partition 70 ensures that, in the event that electronic units 68a and 68b generate different amounts of heat, the air flowing upwardly through heat dispersion member 63a and the respective channel or compartment of duct 67 will be independent of, and not influenced by the rate of air flow through heat dispersion member 63b and the respective channel or compartment of duct 67, whereby the dispersion of heat from each of the electronic units 68a and 68b will be most efficiently achieved. In the absence of partition 70, the unequal generation of heat by electronic units 68a and 68b, and hence the unequal rates of flow of air from the channels between fins 62a and 62b will result in turbulent air flow within duct 67, and such turbulent air flow in duct 67 will interfere with the efficient dispersing of heat by convection. The importance of the ducts 17 and 67 in the heat dispersion devices 11 and 61 according to this invention will be apparent from FIG. 8 on which the temperature of the heat dispersion member is plotted as the abscissa, and the time of operation of the associated heat-generating electronic unit or units is plotted as the ordinate. On FIG. 8, the curve $a$ shows the temperature-time characteristic for a heat dispersion device similar to the device 11 of FIGS. 1-3, but in which the portion of duct 17 above the top surface of heat dispersion member 16 is eliminated, and the heat dispersion member is given a height H equal to the total height of the heat dispersion member 16 and the duct 17 in the device according to this invention. It will be seen that such heat dispersion device attains a temperature of about 80°C after approximately ½ hour of operation of the associated heat-generating electronic unit. The curve $b$ on FIG. 8 shows the temperature-time characteristic for the heat dispersion device 11 according to this invention in which the height $h$ of the heat dispersion member 16 is one-half the overall height H of the device including the duct 17. Although the heat-generating electronic unit associated with the heat dispersion device 11 having its temperature-time characteristic represented by the curve $b$ was the same as the heat-generating electronic unit employed with the device represented by the curve $a$, it will be seen that the maximum temperature of the heat dispersion device 11 is only about 70°C., and is only reached after about one hour of operation. The importance of having the overall height H of the device at least twice as large as the height $h$ of the heat dispersing member 16 is apparent from a comparison of curve $b$ with curve $c$ on FIG. 8 which shows the temperature-time characteristic for a heat dispersion device similar to the device 11 according to this invention, but in which the height $h$ of the heat dispersion member 16 is two-thirds of the overall height H of the device including the air duct 17. Finally, the curve $b$ on FIG. 8 shows the temperature time characteristic for the heat dispersion device 61 shown on FIGS. 6 and 7, and in which the duct 67 is mounted on a pair of heat dispersion members 63a and 63b and is provided with the partition or separator 70, with the overall height of such device 61 being more than twice as large as the height of the heat dispersion members 63a and 63b.

Referring now to FIG. 9, it will be seen that the three curves appearing thereon represent the temperature-time characteristics for heat dispersion devices similar to the device 11 of FIGS. 1-3, but in which the spacings $a$ between the adjacent fins 12 are respectively 3mm., 5mm. and 10mm. Although the tests represented by the curves on FIG. 9 were conducted with electronic units generating greater amounts of heat than those used in the tests represented by the curves on FIG. 8, so that, in each case, represented on FIG. 9, the temperature to which the heat dispersion member rises is higher than the maximum temperature of the heat dispersion member represented by the curve $b$ on FIG. 8, it will be seen from the curves on FIG. 9 that the maximum temperature for a spacing of 5mm. between the fins 12 is less than the maximum temperature when the spacing between the fins is either 3mm. or 10mm. As previously noted herein, the relatively higher temperature attained when the spacing between the fins is 3mm. results from the fact that the relatively higher viscous resistance to movement of the air in the channels 13 between the fins 12 reduces the speed of movement of the air through such channel by convection. On the other hand, when the spacing between the fins is 10mm., the heat is dispersed from the fins 12 primarily into the layers of air in channels 13 which are immediately adjacent such fins, that is, the air within each channel 13 is not uniformly heated, and thus the dispersion effect is reduced.

As previously mentioned, the very efficient dispersion of heat in a device according to this invention results from the high speed convection of air through the channels between the fins, and such high speed convection results, in turn, from the proper dimensioning of the channels between the fins and the proper dimensioning of the duct 17 or 67 by which the draft or chimney effect is achieved. By reason of the highly efficient heat dispersion characteristic of devices according to this invention, such devices, and particularly the heat dispersion members 16 or 63a and 63b thereof can be made relatively small, as compared with conventional heat sinks, whereby to reduce the cost of the heat dispersion devices and the space required therefor within an electronic apparatus.

Figure 11:
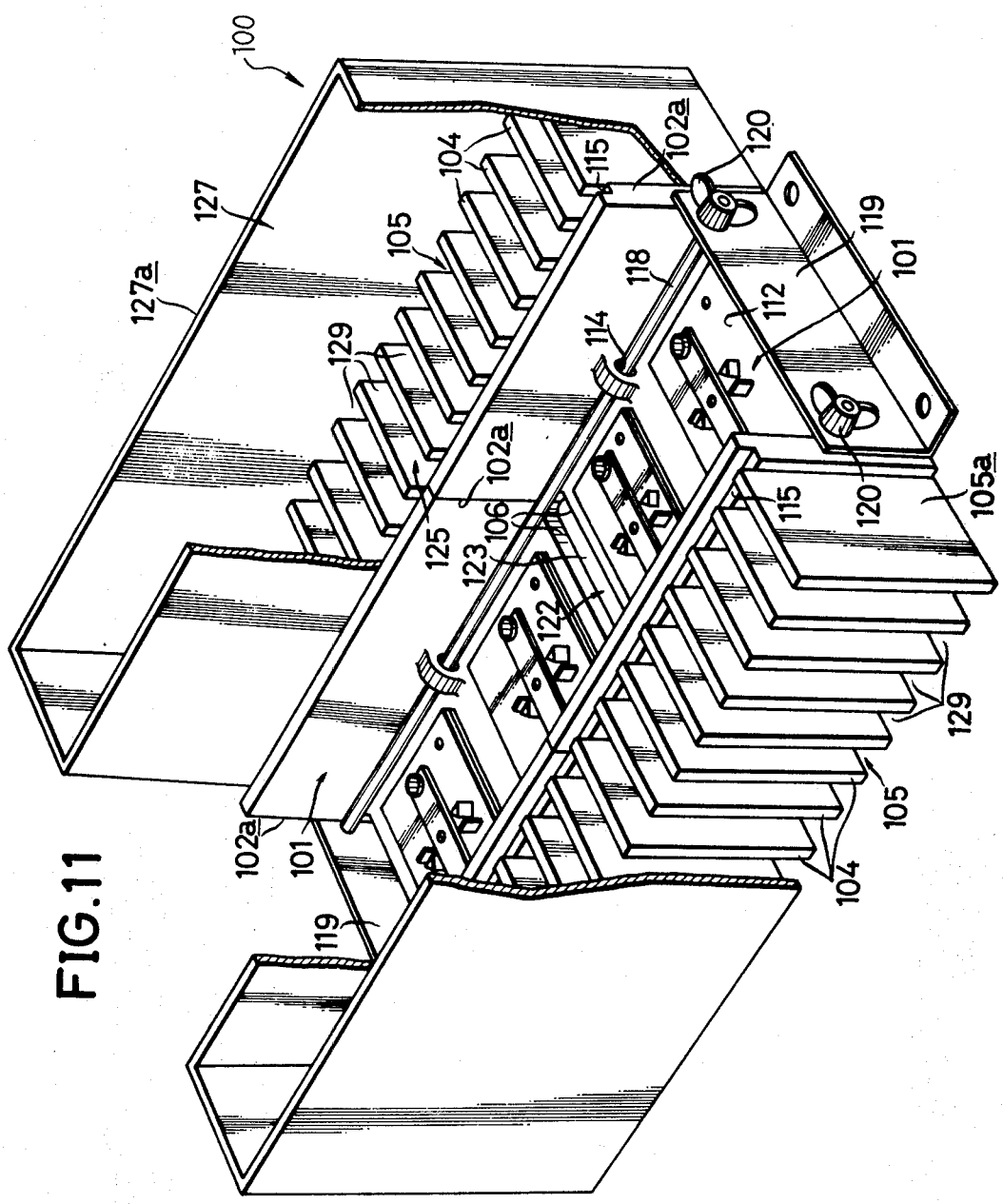
FIG. 11 is a perspective view of a heat dispersion device constituted by an assembly of two of the units shown on FIG. 10.
Figure 12:
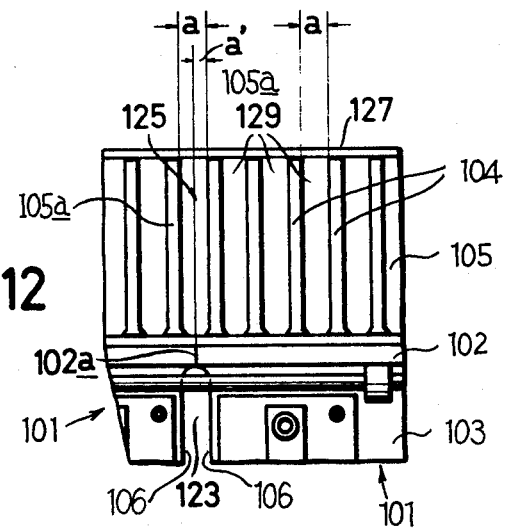
FIG. 12 is a fragmentary top plan view of the heat dispersion device of FIG. 11.

Referring now to FIGS. 10 and 11, it will be seen that a heat dispersion device 100 according to another embodiment of this invention may be formed of a selected number of heat dispersion members 101 which are assembled together, as hereinafter described, and associated with ducts 127. More specifically, as shown on FIG. 10, each heat dispersion member 101 has a body of H-shaped cross-section including vertical side plates 102 and a horizontal connecting plate or web 103 extending between side plates 102 approximately midway between the upper and lower edges of the latter. Sets 105 of substantially parallel, spaced apart fins 104 extend outwardly from side plates 102, with the spacing $a$ (FIG. 12) between adjacent fins 104 in each set 105 being in the range between 3 and 10 mm., and preferably in the range between 5 and 7mm., as previously described. Further, as shown on FIG. 12, the fin 105a at each end of each set 105 is spaced from the adjacent end surface 102a of the respective side plate 102 by a distance $a'$ which is one-half the spacing $a$ between adjacent fins 104 in the set 105. The end edges of web 103 are preferably recessed, as at 106, relative to the adjacent end edge surfaces 102a of side plates 102.

The web 103 of heat dispersion member 101 is adapted to have two heat-generating power transistors 107 mounted thereon. For example, the power transistors 107 can be secured to the underside of web 103 by screws 113 received in tapped holes 108a in the web. Web 103 further has holes therein, as at 108b and 108c, to permit the passage therethrough of leads extending from the emitter and collector electrodes of each transistor 107, and a terminal block 112 for each transistor 107 is disposed on the upper surface 103b of web 103 and is provided with a base terminal 109, an emitter terminal 110 and a collector terminal 111 for connection to the respective leads extending through the holes of web 103 from the transistor 107 at the underside 103a of the web.

In order to permit the assembling together of a plurality of the heat dispersion members 101, each member 103 further has a bore 114 in a lug extending between the top surface 103b of its web 103 and each of the side plates 102. Further, in order to facilitate the mounting of the ducts 127 on one or more of the heat dispersion members 101, each of the side plates 102 has a groove or rabbet 115 extending along its upper edge.

As shown on FIG. 11, two or more of the previously described heat dispersion members 101 may be assembled together with their side plates 102 in end-to-end relation so as to provide a heat dispersion device 100 having a desired heat-dispersing capacity. The heat dispersion members 101 are shown to be assembled together by a pair of connecting bolts 118 extending through the bores 114 of members 101 and having threaded end portions extending through respective holes in fastening plates 119 which abut against the free end edges 102a of side plates 102. The threaded ends of bolts 118 receive winged nuts 120 by which the assembly of two or more of heat dispersion members 101 is completed. When the heat dispersion members 101 are thus assembled together, it will be seen that, at each joint 122 therebetween, the recessed end edges 106 of the respective webs 103 define an elongated opening 123 through which heat can escape upwardly from below the webs 103. Further, as shown on FIG. 12, at each joint 125 between the sets 105 of fins onto heat dispersion members, the spacing between the adjacent end fins 105a is equal to twice the distance $a'$, that is, equal to the spacing $a$ between adjacent fins 104 in each set 105. In other words, when two or more heat dispersion members 101 are assembled together, as described, the spacing between successive fins at each side of the assembly is uniform from one end to the other of the assembly.

The air ducts 127, each of which may be similar to the duct 17 of previously described device 11, are mounted on the sets 105 of fins provided at the opposite sides of the assembled together members 101 and are suitably secured thereto, as by screws, not shown, with the lower edge of the inner wall of each duct 127 being received in the respective groove or rabbet 115. The outer wall 127a of each duct 127 has its lower portion either contacting, or closely adjacent to the free end edges of the respective sets 105 of fins so that the lower portion of duct wall 127a, the respective side plates 102 and the sets 105 of fins cooperate to divide the lower portion of each duct 127 into a large number of channels 129 which are open at their upper and lower ends.

As in the previously described embodiments of this invention, the heat generated by transistors 107 is dispersed through the respective members 101 and, from the fins 104 and 105a of the latter, is transferred to the air in channels 129 which, as previously described, expands and rises, due to the heating thereof, so as to flow from channels 129 into the respective ducts 127 for discharge at the open upper ends of the latter. As before, each of the ducts 127 provides a chimney-effect which creates a draft for very substantially increasing the flow rate of the air through channels 129, whereby the necessary heat exchange or transfer is rapidly performed and efficient heat dispersion is attained. Furthermore, the air heated in the space 131 (FIG. 10)

under connecting plates 103 and between side plates 102 is discharged effectively through the opening or openings 123 with the result that heated air is not trapped within the space 131 and the described heat dispersing effect can be attained.

Figure 13:
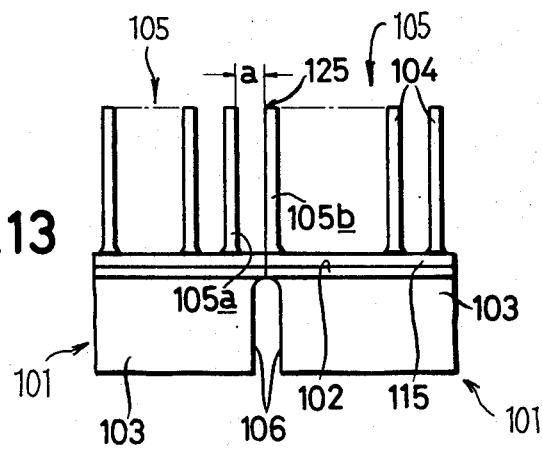
FIG. 13 is a fragmentary top plan view of a modification of the heat dispersion device of FIGS. 10 to 12.

Referring now to FIG. 13, it will be seen that, in a modification of the arrangement described above with reference to FIGS. 10–12, the fin 105a at one end of each set 105 of fins may be spaced by the distance a from the adjacent end edge surface of the respective side plate 102, while the fin 105b at the opposite end of the set 105 of fins has its surface aligned with the adjacent end edge surface of the side plate 102. Thus, when two or more of the heat dispersion members 101 are assembled together with their side plates 102 in end-to-end relation, the spacing a between the adjacent end fins 105a and 105b will be the same as the spacing a between adjacent fins 104 within each set 105 of the fins. Of course, the foregoing uniformity of the spacing of the fins along the assembled together heat dispersion members 101 can be achieved by other arrangements of the end fins 105a and 105b, for example, by spacing the end fin 105a a distance of ⅔a from the adjacent end of the side plate 102 while the other end fin 105b is spaced from the adjacent end of the side plate by the distance ⅓a.

Since each of the heat dispersion members 101, when associated with the ducts 127, has a predetermined heat-dispersing capacity, it will be apparent that, by selecting a suitable number of such heat dispersion members 101 for assembling together, as described above, the overall heat-dispersing capacity can be very simply adjusted so as to accommodate the heat generated by any particular electronic unit to be mounted thereon.

Although several preferred embodiments of the invention have been described in detail herein with reference to the accompanying drawings, it is to be understood that the invention is not limited to those precise embodiments, and that various changes and modifications may be effected therein by one skilled in the art without departing from the scope or spirit of the invention, as defined in the appended claims.

What is claimed is:

1. A heat dispersion device, comprising at least one heat dispersion member of heat conducting material including a first portion for receiving at least one heat-generating electronic element thereon and a second portion connected to said first portion and having at least one set of spaced apart fins defining channels therebetween which open at the top and bottom of said set of fins, said fins being positioned parallel to each other and uniformly spaced apart in the range between 5mm and 10mm; and at least one open ended duct having one end mounted on said second portion of said heat dispersion member and extending upwardly from said top of the set of fins in communication with said channels, a portion of said duct cooperating with said second portion of said heat dispersion member to define a conductive passageway for heated air to pass through said channels and through said duct for exhaust at the other end of the latter.

2. A heat dispersion device as in claim 1; in which the distance from said bottom of the set of fins to said other end of the duct is at least twice as large as the distance between said top and bottom of said set of fins.

3. A heat dispersion device as in claim 2; in which said second portion of the heat dispersion member is in the form of a plate having said fins extending from one side thereof, and said one end portion of said duct extends about said heat dispersion member with the exception of the other side of said plate on which the heat-generating electronic element is received.

4. A heat dispersion device as in claim 2; in which said second portion comprises a pair of side plates each having a set of said fins extending outwardly therefrom and said first portion comprises a web extending between said side plates to thereby form a body of said heat dispersion member having H-shaped cross-section; and in which said one duct extends upwardly from the set of fins on one of said side plates, and a second duct similar to said one duct extends upwardly from the top of the set of fins on the other of said side plates in communication with the channels between the respective set of fins.

5. A heat dispersion device as in claim 4; in which a second heat dispersion member identical with said one heat dispersion member is secured to the latter with the side plates of said second heat dispersion member arranged in end-to-end relation to the side plates of said one heat dispersion member; and in which said one duct also extends upwardly from, and is in communication with the channels between the set of fins extending from said one side plate of the second heat dispersion member, and said second duct also extends upwardly from, and is in communication with the channels between the set of fins extending from said other side plate of said second heat dispersion member.

6. A heat dispersion device as in claim 5; in which the end edges of said web of each of the heat dispersion members have recesses therein which, when said heat dispersion members are secured together, define at least one opening for the upward escape of heated air from below said web of each heat dispersion member.

7. A heat dispersion device as in claim 5; in which the fins at the ends of each of said sets are located in respect to the adjacent ends of the respective side plate so that, with said one heat dispersion member and said second heat dispersion member secured together, the spacing between the fins at adjacent ends of sets thereof on said one and second heat dispersion members, respectively, is equal to the spacing between the fins in each of said sets.

8. A heat dispersion device as in claim 1; further comprising a second heat dispersion member identical with said one heat dispersion member and arranged with the fins of said second heat dispersion member directed toward the fins of said one heat dispersion member, and in which said one end portion of said duct is also mounted on said second heat dispersion member in communication with the channels defined between the fins of said second heat dispersion member.

9. A heat dispersion device as in claim 8; in which said duct has a partition therein for segregating the heated air streams flowing upwardly in said duct from the channels of said one heat dispersion member and said second heat dispersion member, respectively.

10. A heat dispersion device as in claim 9; in which said partition extends between the fins of said one heat dispersion member and the fins of said second heat dispersion member.

11. A heat dispersion device as in claim 9; in which said portion of each of said one heat dispersion member and said second heat dispersion member is in the form of a plate having the respective fins extending from one side thereof, and the other side of each said plate is adapted to have the respective heat-generating electronic element mounted thereon.

* * * * *